United States Patent [19]

Taylor

[11] Patent Number: 5,025,226
[45] Date of Patent: Jun. 18, 1991

[54] HIGH-GAIN LOW-NOISE AMPLIFIER
[75] Inventor: Stewart S. Taylor, Beaverton, Oreg.
[73] Assignee: TriQuint Semiconductor, Inc., Beaverton, Oreg.
[21] Appl. No.: 487,360
[22] Filed: Mar. 2, 1990
[51] Int. Cl.[5] .............................................. H03F 3/16
[52] U.S. Cl. .................................. 330/277; 330/311; 330/296
[58] Field of Search .............. 330/107, 109, 277, 294, 330/296, 297, 302, 307, 311

[56] References Cited
U.S. PATENT DOCUMENTS
4,658,220 4/1987 Heston et al. .................. 330/311 X Primary Examiner—Steven Mottola
Attorney, Agent, or Firm—Paul S. Angello; Peter J. Meza

[57] ABSTRACT

A high-gain, low noise solid-state multiple stage amplifier (12) includes a phase-inverting input stage (20) and a phase non-inverting output stage (30). The input stage includes a first transistor ($Q_1$) having a current-dependent transconductance value. The first transistor is operatively connected to a load resistor ($R_{L1}$) through which a load current ($I_1$) flows. An amplified phase-inverted version of a time-varying signal applied to the input ($V_i$) is developed across the load resistor. The value of the load resistor together with the transconductance value affects the voltage gain of the input stage. A resistor ($R_2$) provides a supplemental bias current ($I_2$) to a current summing node (A). The current summing node sums the load current and the supplemental bias current and provides the first transistor with a total current ($I_d$) that affects the transconductance value. The value of the supplemental bias current is chosen to supplement the load current to provide a predetermined total current so that the voltage gain may be selected by adjusting the load resistor without changing the transconductance value. The output stage includes a second transistor ($Q_6$) having an input terminal that receives at the output ($V_0'$) of the input stage the amplified phase-inverted version of the input signal. The output stage amplifies but does not further phase-invert the input signal. The input and output stage cooperate to provide the amplifier with high overall gain and wide bandwidth properties.

19 Claims, 2 Drawing Sheets

HIGH-GAIN LOW-NOISE AMPLIFIER

FIELD OF THE INVENTION

The present invention relates to electronic signal amplifiers and, in particular, to a two-stage high-gain, low-noise solid-state amplifier.

BACKGROUND OF THE INVENTION

Each amplification stage of a multistage amplifier introduces noise and phase shift into the signal it amplifies. It is, therefore, desirable to use an amplifier having few amplification stages with high gain and low noise. Currently available single-stage amplifiers implemented with short-channel field effect transistors (FETs) are capable of high-speed operation but provide relatively low amounts of gain or exhibit poor noise performance.

FIG. 1 shows a prior art low-gain amplifier circuit 10 having a single amplification stage comprised of FETs $Q_1$ and $Q_2$ connected in cascode arrangement. An input signal, $V_i$, which is developed from the current delivered by an input current source, $I_i$, is applied to the gate terminal of $Q_1$. A FET transistor $Q_3$ functions as a current source for biasing diodes $D_3$ and $D_4$ that ensure a sufficient drain-to-source voltage across $Q_1$.

A FET $Q_4$ and diodes $D_5$, $D_6$, $D_7$, $D_8$, and $D_9$ form a source follower and DC voltage level shifter. A FET $Q_5$ functions as a current source for $Q_4$, and diodes $D_1$ and $D_2$ drop a DC voltage, ensuring sufficient drain-to-source voltage for $Q_5$ when $V_i = V_0$ (e.g., when a feedback resistor, $R_f$, is connected between the drain terminal of $Q_5$ and the gate terminal of $Q_1$). The use of $R_f$ as described forms a transimpedance amplifier whose bandwidth is dependent on the voltage gain of the amplifier. The bandwidth of such a transimpedance amplifier is approximately equal to $A_v/(2\pi R_f C)$, where $A_v$ is the voltage gain of the amplifier and C is the total input capacitance. Each of the transistors $Q_1$, $Q_2$, and $Q_5$ is a depletion-mode gallium arsenide (GaAs) metal semiconductor field effect transistor (MESFET).

A resistor, $R_L$, which is represented in FIG. 1 as a variable resistor, is connected between $V_{dd}$ and the drain terminal of $Q_2$ to provide a passive load resistance for amplifier 10. A resistive load provides amplifier 10 with lower noise characteristics than those achievable with an active load consisting of a transistor connected as a current source. An active transistor load would typically have channel noise comparable to that of $Q_1$ and, therefore, degrade the noise performance by approximately 3 dB. On the other hand, a resistive load has thermal noise that is typically three to ten times smaller than the channel noise of a transistor load. The voltage gain $A_v$, measured from the gate terminal of $Q_1$ to the drain terminal of $Q_2$, is approximately equal to the transconductance $g_m$ of $Q_1$ multiplied by $R_L$, as expressed in equation (1) below:

$$A_v = -g_m R_L. \quad (1)$$

It is known that the transconductance, $g_m$, is proportional to the square root of the current $I_d$ that enters the drain of $Q_1$, which is expressed in equation (2), below:

$$g_m \propto (I_d)^{\frac{1}{2}}. \quad (2)$$

Equation (1) indicates that $A_v$ increases as the value of $R_L$ increases. An increase in the value of $R_L$ causes a corresponding decrease in the value of $I_d$, which flows through $R_L$. Equation (2) indicates, however, that a decrease in the value of $I_d$ decreases the value of $g_m$, thereby counteracting the increase in $A_v$ caused by an increase in the value of $R_L$. Therefore, according to equations (1) and (2), $A_v$ does not increase linearly with an increase in $R_L$. As a consequence, the maximum value of $A_v$ is lower than desired. Moreover, as $R_L$ increases in value, the output resistance present at the drain of $Q_2$ lowers the effective load resistance present at the drain terminal of $Q_2$, thereby further limiting the overall gain, $A_v$.

A practical implementation of circuit 10 that provides $A_v = -13$ would include values of $R_L = 500$ ohms, $V_{ss} = -5$ volts, $V_{dd} = +5$ volts, and $I_d = 10$ milliamperes. The output impedance, $R_o$, of common gate stage $Q_2$ would be approximately 3.25 kilohms. Transistor $Q_1$ would have $g_m = 30$ millimhos, gate width = 500 microns, $f_T = 15$ GHz, and pinchoff voltage $V_p = -0.7$ volts.

The discussion presented above indicates that there is a tradeoff between gain and noise associated with the type of load selected for $R_L$, a passive load providing lower noise and lower gain and an active load providing higher noise and higher gain. For a transimpedance amplifier, the amount of noise decreases as the values of resistors $R_f$ and $R_L$ increase. The use of a short channel FET, which has a relatively low capacitance, $C_T$, facilitates the design of a transimpedance amplifier of increased bandwidth, which, as indicated above, is determined in part by the gain. As the value of $R_f$ increases, there is, therefore, a need to increase the amplifier gain to maintain or increase the amplifier bandwidth.

One possible expedient is to increase the overall amplifier gain by using multiple amplification stages of the type shown in FIG. 1. The use of multiple amplification stages that are inverting is disadvantageous in at least two respects. First, at least three stages are required to provide an odd integer number of stages for negative feedback. Second, the accumulated phase shift introduced by the amplification stages tends to cause stability problems or restrict the usable bandwidth.

SUMMARY OF THE INVENTION

An object of the invention is, therefore, to provide a high-gain, low-noise amplifier having a minimum number of amplification stages.

A further object of the invention is to provide such an amplifier in a short-channel, high-speed technology such as GaAs that can be suitably employed as a transimpedance amplifier.

A preferred embodiment of a high-gain, low-noise multiple stage solid-state amplifier designed in accordance with the present invention includes a phase inverting input stage and a phase non-inverting output stage. The input stage includes a first transistor having a current dependent transconductance value. The first transistor is operatively connected to a load resistor through which a load current flows. An amplified phase-inverted version of a time-varying input signal is developed across the load resistor. The value of the load resistor together with the transconductance value of the first transistor affects the voltage gain of the input stage. A bias resistor provides a supplemental bias current to a current summing node. The current summing node sums the load current and the supplemental bias current and provides the first transistor with a total current that determines the transconductance value. The value of the supplemental bias current is chosen to supplement the load current to provide a predetermined total current so that the voltage gain may be selected by adjusting the load resistor without changing the transconductance value of the first transistor.

Alternatively, the voltage gain of the input stage may be enhanced by increasing the supplemental bias current and transistor size in a known manner while maintaining a fixed value of the load resistor.

The output stage includes a second transistor having an input terminal that receives at the output of the input stage the amplified phase-inverted version of the input signal. The output stage amplifies but does not further phase-invert the input signal. The input and output stages cooperate to provide the amplifier with high overall gain and wide bandwidth properties.

DETAILED DESCRIPTION OF PREFERRED EMBODIMENT

Figure 2:
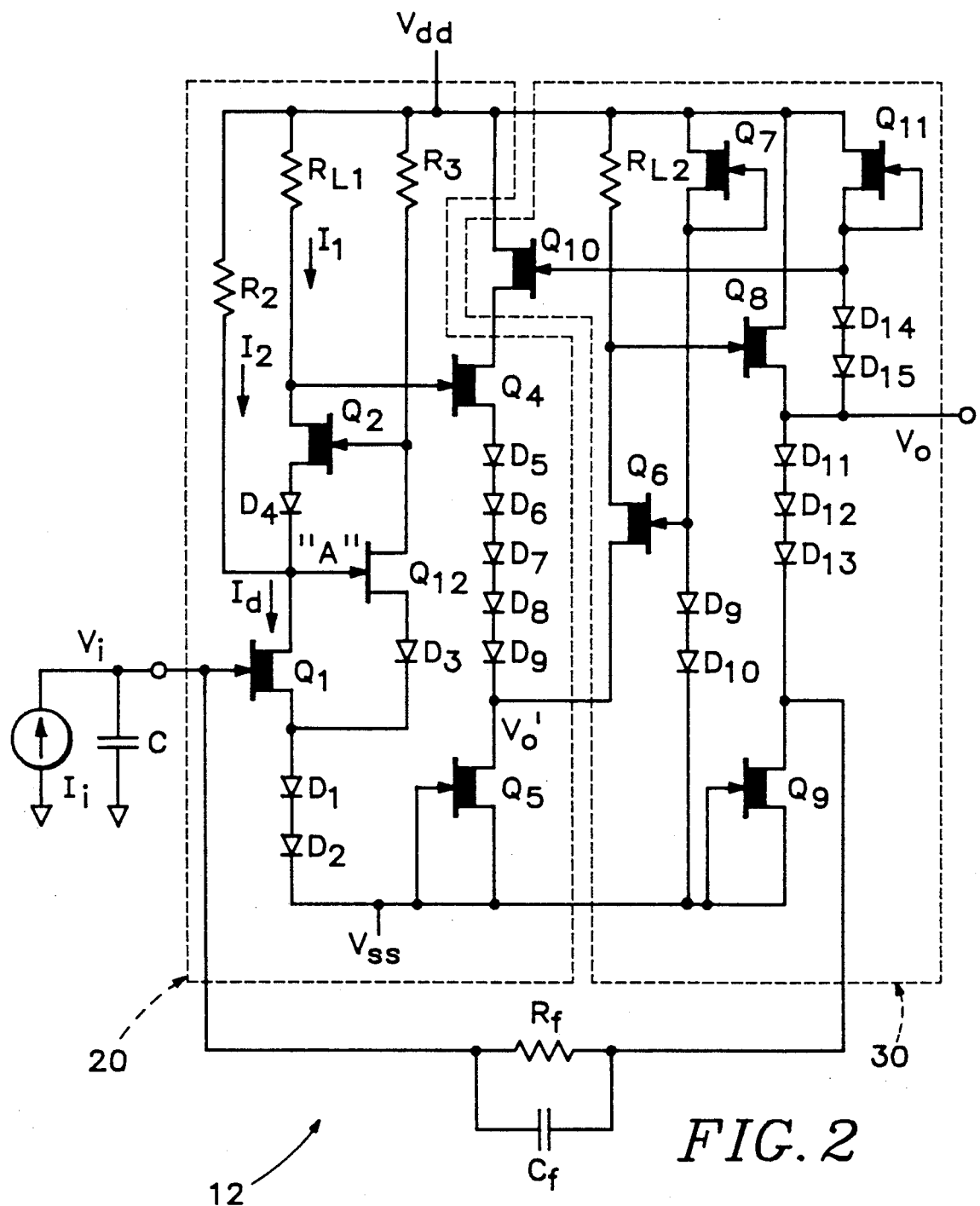
FIG. 2 shows a high-gain, low-noise two-stage amplifier circuit configured in accordance with the present invention.

FIG. 2 shows a high-gain, low-noise two-stage amplifier circuit 12 configured in accordance with the present invention. Amplifier 12 includes a phase-inverting input stage 20 and a phase noninverting output stage 30. Amplifier 12 includes feedback resistor $R_f$ and capacitor $C_f$ to form a very high-gain multi-stage transimpedance amplifier.

Input stage 20 receives on its input terminal, $V_i$, a time-varying signal developed from a current source, $I_i$, and a capacitor, C. Input stage 20 develops on its output terminal, $V_o'$, an amplified, phase-inverted version of $V_i$. Input stage 20 includes transistors $Q_1$, $Q_2$, $Q_4$, and $Q_5$, which are of the same type shown in FIG. 1. The implementation of the invention is not, however, limited to GaAs devices or any other particular type of transistor. A resistor $R_3$, which is connected between $V_{dd}$ and the gate terminal of $Q_2$, replaces the transistor $Q_3$ configured as a bias current source in FIG. 1.

Figure 1:
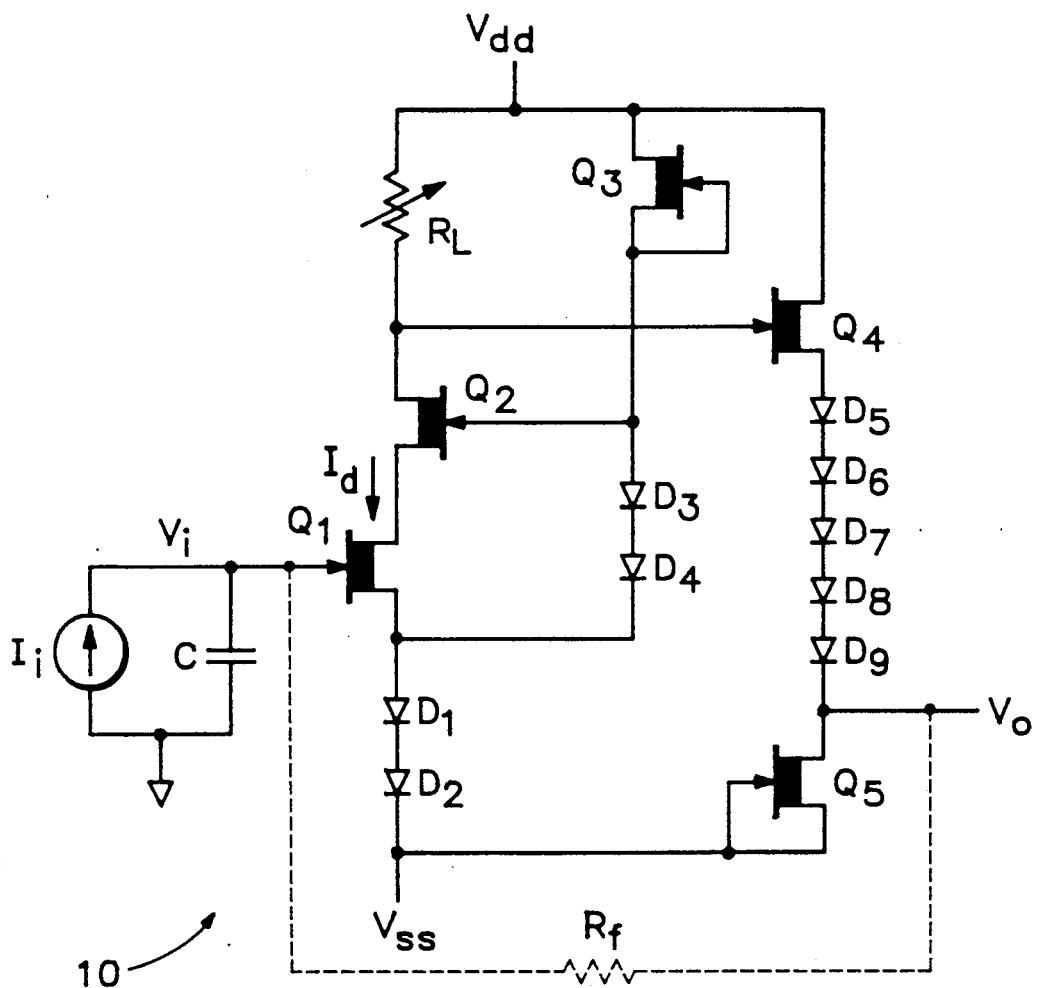
FIG. 1 shows a prior art single-stage amplifier circuit.

A bias resistor $R_2$ and a transistor $Q_{12}$, which is preferably of the enhancement mode MESFET type, are added to amplifier circuit 10 in FIG. 1. Diodes $D_3$ and $D_4$, which are reconfigured to accommodate the addition of $Q_{12}$, shift the DC voltage levels at the source terminals of $Q_1$ and $Q_2$ to provide the proper operating drain-to-source voltages for $Q_1$ and $Q_{12}$. Input stage 20 operates in a manner that substantially eliminates the dependence of $I_d$ on the value of $R_{L1}$ and increases the impedance looking into the drain of $Q_2$, thereby permitting the selection of $R_{L1}$ without affecting the value of $g_m$ for $Q_1$.

As shown in FIG. 2, a current $I_d$ flows into the drain of $Q_1$; a current $I_1$ flows through resistor $R_{L1}$, which is connected between $V_{dd}$ and the drain of $Q_2$; and a current $I_2$ flows through resistor $R_2$, which is connected between $V_{dd}$ and the drain of $Q_1$. Because of the relatively high input impedance of $Q_{12}$, current $I_d$ is essentially equal to $I_1 + I_2$. Thus, $I_d$ flows out of node "A" and $I_1 + I_2$ flows into node "A."

A negative feedback loop is created by the connection of the gate and drain terminals of $Q_{12}$ to the respective source and gate terminals of $Q_2$ as shown. This feedback loop provides a low input impedance at node "A" and a high output impedance, $R_o$, into the drain of $Q_2$. The presence of $Q_{12}$ causes the output impedance $R_o$ to be comparable to or greater than $R_{L1}$, notwithstanding the presence of $R_2$. The absence of $Q_{12}$ would result in $R_2$ lowering the value of the impedance presented at the drain of $Q_2$ and, therefore, the voltage gain $A_v$, of the amplifier. If $R_2$ were replaced by a higher impedance current source transistor, the noise performance of the circuit would be degraded. Resistor $R_2$ provides a current $I_2$ that affects the value of $I_d$ and the value of $g_m$ of $Q_1$. Therefore, selecting a value of $R_{L1}$, and thereby changing the value of $I_1$, need not appreciably change the value of $I_d$. This is so because the value of $R_2$ can be changed to provide a corresponding change in $I_2$ that offsets a change in $I_1$ and thereby maintains $I_d$ and $g_m$ at constant values. The result is that the gain, $A_v$, from the gate of $Q_1$ to the drain of $Q_2$ can be made much larger than that of amplifier circuit 10 of FIG. 1.

The gate width of transistor $Q_2$ is typically made much smaller than that of $Q_1$, such that the output impedance of $Q_2$ is correspondingly higher. The impedance $R_o$ is approximately inversely proportional to the width of $Q_2$ and is proportional to the voltage gain provided by $Q_{12}$.

The voltage gain, $A_v$, of input stage 20 is approximately equal to $g_m$ of $Q_1$ multiplied by $R_{L1}$ in parallel with $R_o$, as expressed in equation (3), below:

$$A_v = -g_m[R_o \| R_{L1}]. \qquad (3)$$

In equation (3), $R_o$ is made comparable to or larger than $R_{L1}$, which is made large to increase the voltage gain, $A_v$. The negative feedback provided by $Q_{12}$ keeps $R_o$, and thus $A_v$, high. The value of $R_o$ in the present invention is typically five to ten times that achievable by the prior art circuit 10. The gain, $A_v$, from the gate of $Q_1$ to the drain of $Q_2$ can be greater than 100 for the component values given with reference to amplifier circuit 10, and for $R_2 = 850$ ohms, $R_3 = 2.5$ kilohms, $I_d = 10$ milliamperes, $I_1 = 1$ milliamperes, and $R_{L1} = 5$ kilohms. Without $Q_{12}$, $R_2$ would lower $R_o$ and thereby counteract the increase in $R_{L1}$ and therefore $A_v$.

Although the preferred operation entails the use of positive and negative power supplies for $V_{dd}$ and $V_{ss}$, respectively, the performance of input stage 20 is also superior to that of amplifier circuit 10 when biased by a single power supply. By using resistors $R_{L1}$, $R_2$, and $R_3$ rather than active load/biasing transistor current sources, the noise performance of input stage 20 is enhanced. This increases the sensitivity for transimpedance amplifier applications. Transistor $Q_{12}$ could also be a depletion device, which may require that extra diodes be connected between the source of $Q_{12}$ and the anode of $D_3$, and between the source of $Q_2$ and the anode of $D_4$. These diodes would ensure sufficient drain-to-source voltage across $Q_1$ and $Q_{12}$.

It will be appreciated that the gain, $A_v$, can be increased by keeping $R_{L1}$ and $I_1$ at constant values and increasing the value of current $I_2$ and the ratio of the width to the length of $Q_1$. Ordinarily, the gate length is chosen to be as small as possible and the gate width is selected as needed. This approach would also provide an independent adjustment of the load applied to the drain terminal of $Q_2$ and the value of $g_m$ for $Q_1$ without substantially raising the output impedance of $Q_2$.

Output stage 30 receives on its input terminal, which is the source of a FET $Q_6$, the amplified, phase-inverted version of $V_i$ appearing on the output terminal $V_o'$ of input stage 20. Output stage 30 produces on its output terminal, $V_0$, an amplified, phase non-inverted version of the signal present at $V_0'$, which represents a further amplified phase-inverted version of $V_i$. Output stage 30 includes FET transistors $Q_6$, $Q_7$, $Q_8$, $Q_9$, $Q_{10}$, and $Q_{11}$. Transistors $Q_{10}$ and $Q_{11}$, together with diodes $D_{14}$ and $D_{15}$, form an optional bootstrap circuit that further enhances the gain of output stage 30 by a factor of about two.

Transistor $Q_6$ is connected in a common gate configuration to provide a gain of about ten for output stage 30. The source terminal of $Q_6$ is connected through series-connected diodes $D_5$, $D_6$, $D_7$, $D_8$, and $D_9$ to the source terminal of transistor $Q_4$ of input stage 20. The output impedance of $Q_4$ is approximately equal to $1/g_m$, which is a relatively low value. The common gate configuration of $Q_6$ provides $Q_6$ with an input impedance that approximately equals $1/g_m$ of $Q_6$. Transistor $Q_6$ develops across a load resistor, $R_{L2}$, an amplified replica of the signal appearing at $V_0'$ with a moderate gain of about ten.

Transistor $Q_8$ and diodes $D_{11}$, $D_{12}$, and $D_{13}$ form a source follower buffer and DC voltage level shifter. The drain terminal of $Q_6$ is connected to the gate terminal of transistor $Q_8$, which presents a very high input impedance to the drain of $Q_6$. The source terminal of $Q_8$ is the output terminal $V_0$ of output stage 30 and of amplifier 12. Transistor $Q_9$ functions as a current source for $Q_8$. Transistor $Q_7$ connected as a current source provides current to diodes $D_9$ and $D_{10}$, which drop a DC voltage and thereby ensure a sufficient drain-to-source voltage for $Q_9$.

Output stage 30 does not invert the phase of the signal present at output terminal $V_0'$ of input stage 20. The overall gain of amplifier 12, ranges from about $-200$ to $-1000$, depending in part on the operation of the gain boost circuit formed by transistors $Q_{10}$ and $Q_{11}$ and diodes $D_{14}$ and $D_{15}$. The value of the feedback resistor $R_f$ can range from 10 kilohms to 200 kilohms.

It will be obvious to those having ordinary skill in the art that many changes may be made to the above-described invention without departing from the underlying principles thereof. For example, a different phase-inverting input stage may be substituted for input stage 20 to provide a relatively high-gain amplifier with only two amplification stages and low-noise properties. The reason is that a two-stage amplifier design permits the use of low-noise amplification stages with moderate gain. The overall gain of such a two-stage amplifier is usually sufficient to meet typical requirements. If amplifier 10 of FIG. 1 is substituted for input stage 20 in amplifier 12 of FIG. 2, the overall gain of amplifier 12 would range between $-50$ and $-200$. The scope of the invention should, therefore, be determined only by the following claims.

I claim:

1. A high-gain, low-noise multiple stage solid-state amplifier, comprising:
   phase-inverting input stage means including a first FET for receiving a time-varying input signal and an output FET configured as a source follower, wherein a source terminal of the output FET presents a relatively low output impedance and provides a first output signal representing a substantially phase-inverted version of the input signal having a magnitude amplified by an input stage gain value; and
   phase non-inverting output stage means receiving the first output signal for providing a second output signal representing a substantially phase-inverted version of the input signal having a magnitude amplified by the product of an output stage voltage gain and the input stage voltage gain, the output stage including a second FET connected in a common gate configuration having a source terminal for receiving the first output signal and an output terminal, the source terminal receiving the first output signal and the output terminal providing a non-inverted amplified version of the first output signal;
   whereby the phase-inverting input stage means and phase non-inverting output stage means cooperate to provide the amplifier with high overall gain and wide bandwidth properties.

2. The amplifier of claim 1, in which the input stage includes an input terminal and the amplifier further comprising a feedback impedance electrically connected between the input terminal and the output terminal, thereby to form an amplifier of the transimpedance type.

3. The amplifier of claim 2, in which the feedback impedance includes a resistor.

4. The amplifier of claim 1, in which the first, second, and output FETs are of the gallium arsenide type.

5. The amplifier of claim 1, in which the first, second, and output FETs are implemented in integrated circuit form.

6. A high gain, low noise multiple stage solid-state amplifier, comprising:
   phase-inverting input stage means receiving a time-varying input signal for providing a first output signal representing a substantially phase-inverted version of the input signal having a magnitude amplified by an input stage gain value, the input stage means including a first transistor through which a transistor current flows and having a transistor current-dependent transconductance, the first transistor operatively connected to a load impedance to provide an input stage voltage gain that approximately equals the transconductance of the first transistor times the load impedance, and the input stage means further including supplemental bias current means for providing supplemental bias current that forms a component of the transistor current, the supplemental bias current affecting the transconductance of the first transistor and enabling a change in the input stage voltage gain with substantial mutual independence of the transconductance of the first transistor and the load impedance; and
   phase non-inverting output stage means receiving the first output signal for providing a second output signal representing a substantially phase-inverted version of the input signal having a magnitude amplified by the product of an output stage voltage gain and the input stage voltage gain, the output stage including a second transistor having an input terminal and an output terminal, the input terminal receiving the first output signal and the output terminal providing an non-inverted amplified version of the first output signal;
   whereby the phase-inverting output stage means and phase non-inverting output stage means cooperate to provide the amplifier with high overall gain and wide bandwidth properties.

7. The amplifier of claim 6 in which the first and second transistors are of the field effect type and the second transistor is connected in a common gate configuration with its source constituting the input terminal and its drain constituting the output terminal.

8. The amplifier of claim 6 in which the input stage means includes an amplifier input terminal and the output stage means includes an amplifier output terminal, and further comprises a feedback impedance electrically connected between the amplifier input and output terminals to form a transimpedance amplifier.

9. The amplifier of claim 6 in which the output stage means further comprises an output transistor electrically connected to the output terminal of the second transistor to form an output buffer circuit, the second and output transistors cooperating to determine the output stage gain value.

10. The amplifier of claim 9, further comprising gain boost means cooperating with the second and output transistors to determine the output stage gain value.

11. The amplifier of claim 9, in which the input stage includes a third transistor configured in cascode arrangement with the first transistor, the first and third transistors are of the field effect type, and the third transistor has a drain terminal that provides a load current flowing through the load impedance, and further comprising current summing means for summing the load current and the supplemental bias current to produce the transistor current, the current summing means having an impedance value and the third transistor having an impedance at its drain terminal, and further comprising negative feedback means for lowering the impedance value of the current summing means and raising the impedance at the drain terminal of the third transistor.

12. The amplifier of claim 11, in which the negative feedback means includes a fourth transistor electrically connected to the current summing means and to the third transistor.

13. The amplifier of claim 6, in which a load current flows through the load impedance and further comprising current summing means for summing the load current and the supplemental bias current to produce the transistor current, and in which the input stage means further includes the first transistor, a third transistor having an output terminal and connected in cascode arrangement with the first transistor, and negative feedback means for lowering the impedance value of the current summing means and increasing the impedance at the output terminal of the third transistor.

14. The amplifier of claim 13, in which the negative feedback means comprises a fourth transistor electrically connected to the current summing means and to the third transistor, the fourth transistor providing negative feedback for raising the impedance at the output terminal of the third transistor to facilitate adjustment of the load impedance without changing the transconductance value of the first transistor.

15. The amplifier of claim 13, in which the third transistor is of the field effect type, and the output impedance of the third transistor appears at its drain terminal.

16. The amplifier of claim 6, further comprising negative feedback means electrically connected to the first transistor for providing the input stage means with an output impedance of relatively high value and thereby permitting the use of a load impedance of relatively high value to increase the voltage gain.

17. The amplifier of claim 6, in which the input stage means, the load impedance, and the supplemental bias current means are implemented in integrated circuit form.

18. The amplifier of claim 6, in which the first and second transistors are of the gallium arsenide type.

19. The amplifier of claim 6, in which the load impedance comprises a resistor.

* * * * *